(12) United States Patent
Oki et al.

(10) Patent No.: US 8,218,596 B2
(45) Date of Patent: Jul. 10, 2012

(54) VERTICAL CAVITY SURFACE EMITTING LASER AND METHOD OF MANUFACTURING THE SAME

(75) Inventors: Tomoyuki Oki, Miyagi (JP); Rintaro Koda, Tokyo (JP); Naoki Jogan, Kanagawa (JP); Yuji Masui, Kanagawa (JP); Takahiro Arakida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/317,165

(22) Filed: Oct. 12, 2011

(65) Prior Publication Data

US 2012/0034720 A1 Feb. 9, 2012

Related U.S. Application Data

(62) Division of application No. 12/379,824, filed on Mar. 3, 2009, now Pat. No. 8,085,827.

(30) Foreign Application Priority Data

Apr. 23, 2008 (JP) ................................ 2008-112212

(51) Int. Cl.
*H01S 5/00* (2006.01)

(52) U.S. Cl. ............. 372/46.013; 372/46.01; 372/45.01; 372/50.124; 372/50.11; 438/69; 438/29

(58) Field of Classification Search ............. 372/46.013, 372/46.01, 45.01, 50.124, 50.11; 438/69, 438/29

See application file for complete search history.

(56) References Cited

U.S. PATENT DOCUMENTS

| 2002/0031154 A1 | 3/2002 | Yokouchi et al. | |
|---|---|---|---|
| 2002/0101899 A1* | 8/2002 | Yokouchi et al. | ............... 372/46 |
| 2003/0169795 A1 | 9/2003 | Otoma et al. | |
| 2004/0114654 A1* | 6/2004 | Kaneko | ........................ 372/46 |

FOREIGN PATENT DOCUMENTS

| JP | 2001-094208 A | 4/2001 |
|---|---|---|
| JP | 2001-210908 | 8/2001 |
| JP | 2002-164621 A | 6/2002 |

(Continued)

OTHER PUBLICATIONS

Japanese Office Action issued Feb. 16, 2010 for corresponding Japanese Application No. 2008-112212.
Japanese Office Action issued Sep. 30, 2010 for corresponding Japanese Application No. 2008-112212.

*Primary Examiner* — Kinam Park
(74) *Attorney, Agent, or Firm* — Rader Fishman & Grauer, PLLC (57) ABSTRACT

A Vertical Cavity Surface Emitting Laser capable of decreasing the lowering of the yield due to displacement and separation of a pedestal without enormous increase of the threshold value and more difficult manufacturing process is provided. A base of a mesa spreads over the top face of a lower DBR layer. The base is a non-flat face in which end faces of a plurality of layers are exposed. The non-flat face is generated due to etching unevenness in forming the mesa, and is in a state of a step in which end faces of a low-refractive index layer and a high-refractive index layer included in the lower DBR layer are alternatively exposed. At least one of the layers exposed in the non-flat face in the plurality of low-refractive index layers included in the lower DBR layer is an oxidation inhibition layer.

2 Claims, 11 Drawing Sheets

FOREIGN PATENT DOCUMENTS

| | | |
|---|---|---|
| JP | 2003-188471 A | 7/2003 |
| JP | 2003-258379 A | 9/2003 |
| JP | 2005-093634 | 4/2005 |
| JP | 2007-053243 A | 3/2007 |
| JP | 2007-123313 A | 5/2007 |
| JP | 2008-034637 A | 2/2008 |

* cited by examiner

RELATED ART

VERTICAL CAVITY SURFACE EMITTING LASER AND METHOD OF MANUFACTURING THE SAME

CROSS REFERENCES TO RELATED APPLICATIONS

The present invention is a Divisional application of application Ser. No. 12/379,824, filed on Mar. 3, 2009, which contains subject matter related to Japanese Patent Application JP 2008-112212 filed in the Japanese Patent Office on Apr. 23, 2008, the entire contents of which being incorporated herein by references.

BACKGROUND OF THE INVENTION

1. Field of the Invention

The present invention relates to a Vertical Cavity Surface Emitting Laser (VCSEL) including a laminated structure in the lamination direction and a method of manufacturing the VCSEL.

2. Description of the Related Art

A VCSEL emits light in the direction orthogonal to a substrate differently from the existing edge emitting laser diodes. In the VCSEL, many devices are able to be arranged in a state of a two dimensional array on the same substrate. Therefore, the VCSEL has recently attracted attention as a light source for a digital copy machine or a printer.

Figure 9:
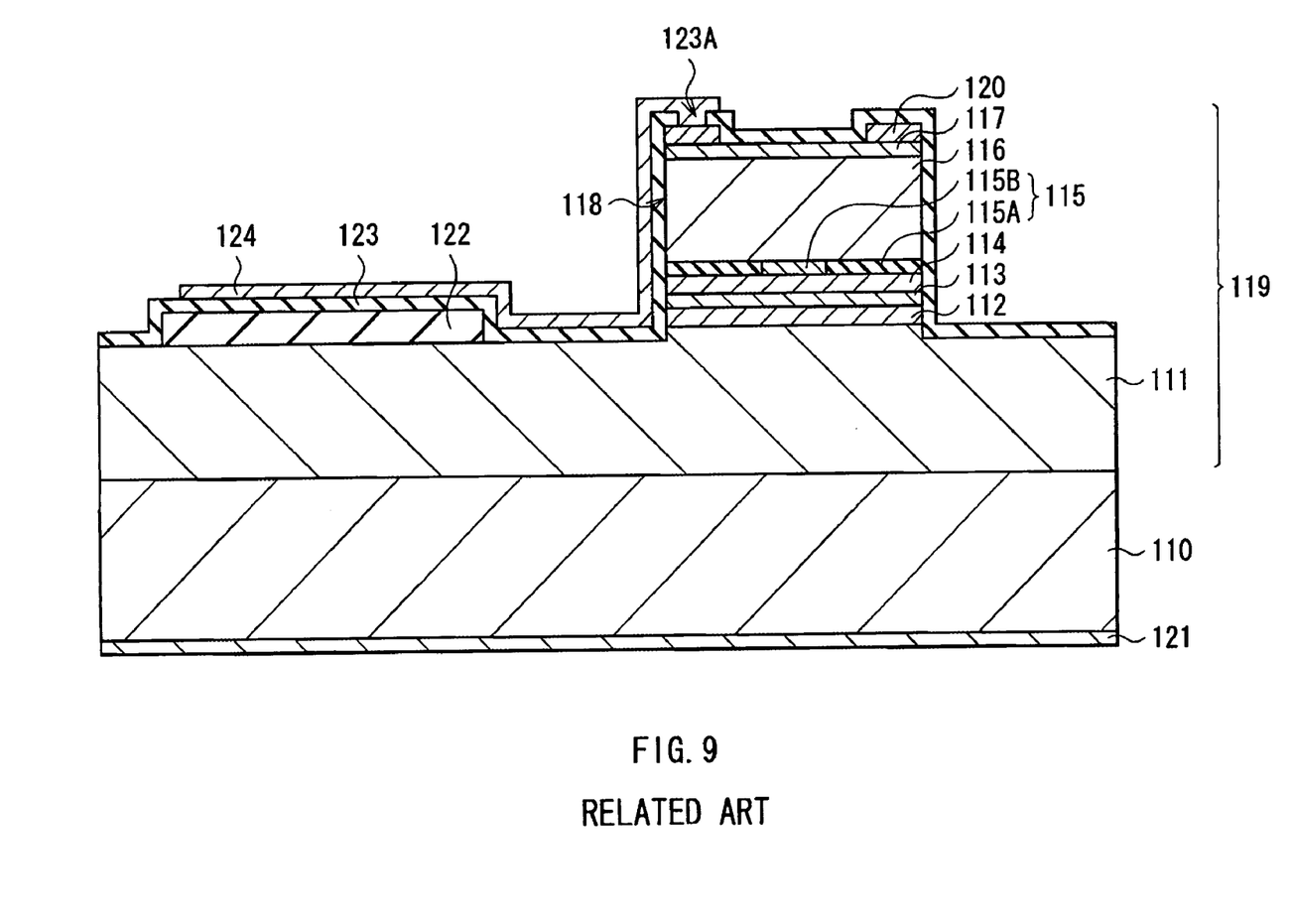
FIG. 9 is a cross sectional view of a laser diode of related art.

For example, as illustrated in FIG. 9, such a type of VCSEL includes a laminated structure 119 in which a lower DBR layer 111, a lower cladding layer 112, an active layer 113, an upper cladding layer 114, a current confinement layer 115, an upper DBR layer 116, and a contact layer 117 are layered from a substrate 110 side in this order on the substrate 110. In the upper section of the laminated structure 119, specifically, in the region from the upper section of the DBR layer 111 to the contact layer 117, a columnar mesa 118 is formed. Further, a circular upper electrode 120 having an aperture in the center is formed on the top face of the mesa 118, and a lower electrode 121 is formed on the rear face of the substrate 110.

Further, in the laser diode, an insulative pedestal 122 is provided in the base region of the mesa 118 in the top face of the lower DBR layer 111 for the purpose of decreasing the capacity component of an electrode pad 124 (described later). Further, an insulative protective film 123 is provided on the entire surface other than part of the upper electrode 120. The protective film 123 has an aperture 123A on the upper electrode 120. In the aperture 123A, the part of the upper electrode 120 is exposed. Further, on the surface of the protective film 123, the electrode pad 124 is formed from the pedestal 122 to the exposed portion in the aperture 123A in the upper electrode 120. For the structure of such a laser diode, for example, a description is given in Japanese Unexamined Patent Application Publication 2001-210908.

In such a laser diode, a current injected from the upper electrode 120 passes the upper DBR layer 116, is confined by the current confinement layer 115, and then reaches the active layer 113. As a result, light is emitted in the active layer 113. The light emitted in the active layer 113 is reflected and amplified by the lower DBR layer 111 and the upper DBR layer 116. After that, the light is emitted as laser light from the aperture provided in the upper electrode 120.

Figure 10:
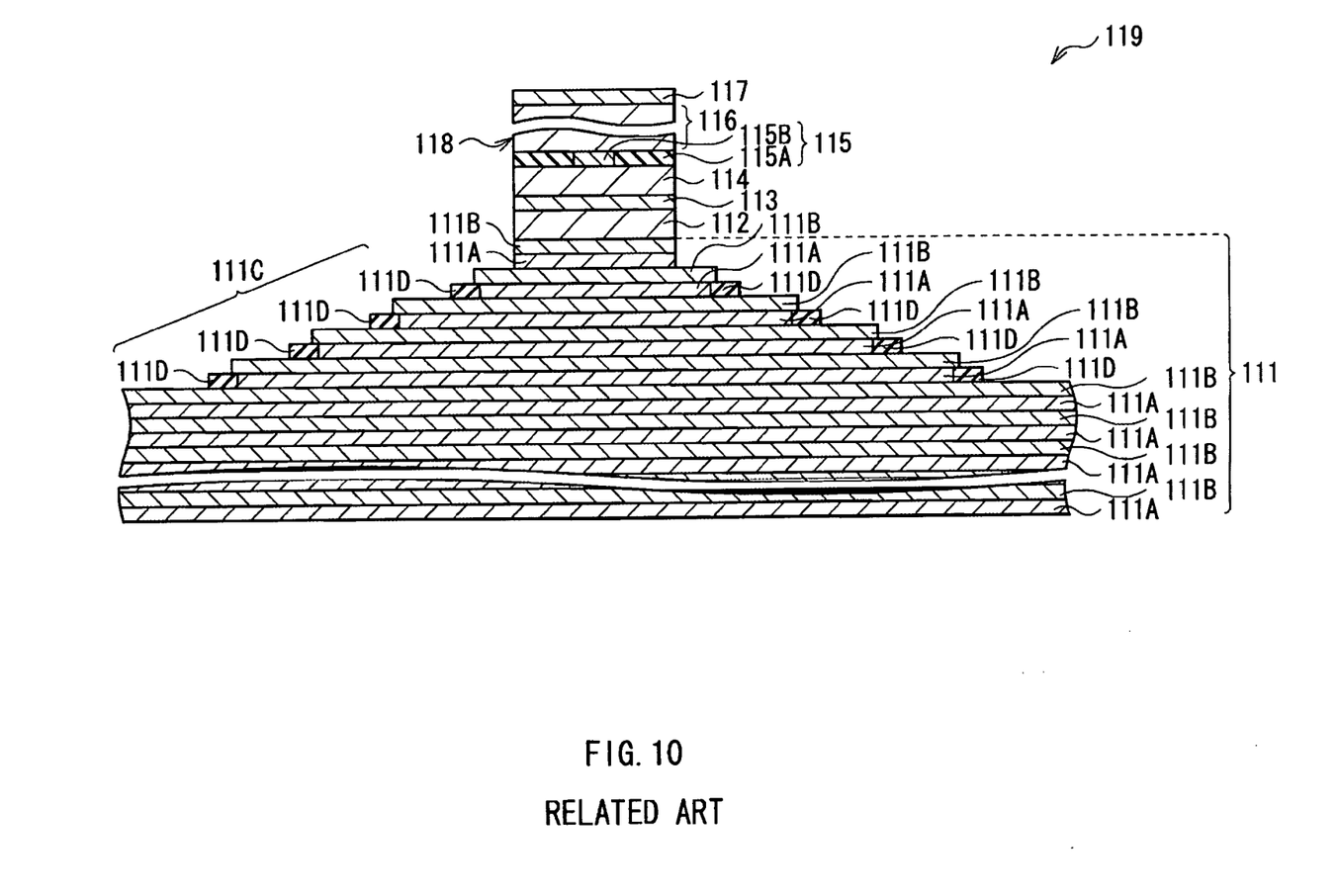
FIG. 10 is an enlarged view of the laminated structure of FIG. 9.

In the foregoing laser diode, in forming the mesa 118, it is necessary to provide etching down to a region under the active layer 113. On the surface after etching, part of the lower DBR layer 111 is exposed. As illustrated in FIG. 10, the lower DBR layer 111 is formed by alternately laminating a low-refractive index layer 111A with a high Al (aluminum) composition and a high-refractive index layer 111B with a low Al composition being $\lambda/4$ thick. FIG. 10 illustrates an enlarged view of the laminated structure 119 of FIG. 9. In general, a distribution in the thickness direction due to etching is larger than $\lambda/4$ ($\lambda$ is an oscillation wavelength of the foregoing laser diode). Thus, the surface after etching is in a step-like non-flat face 111C in which the low-refractive index layer 111A and the high-refractive index layer 11B are alternatively exposed.

Figure 11:
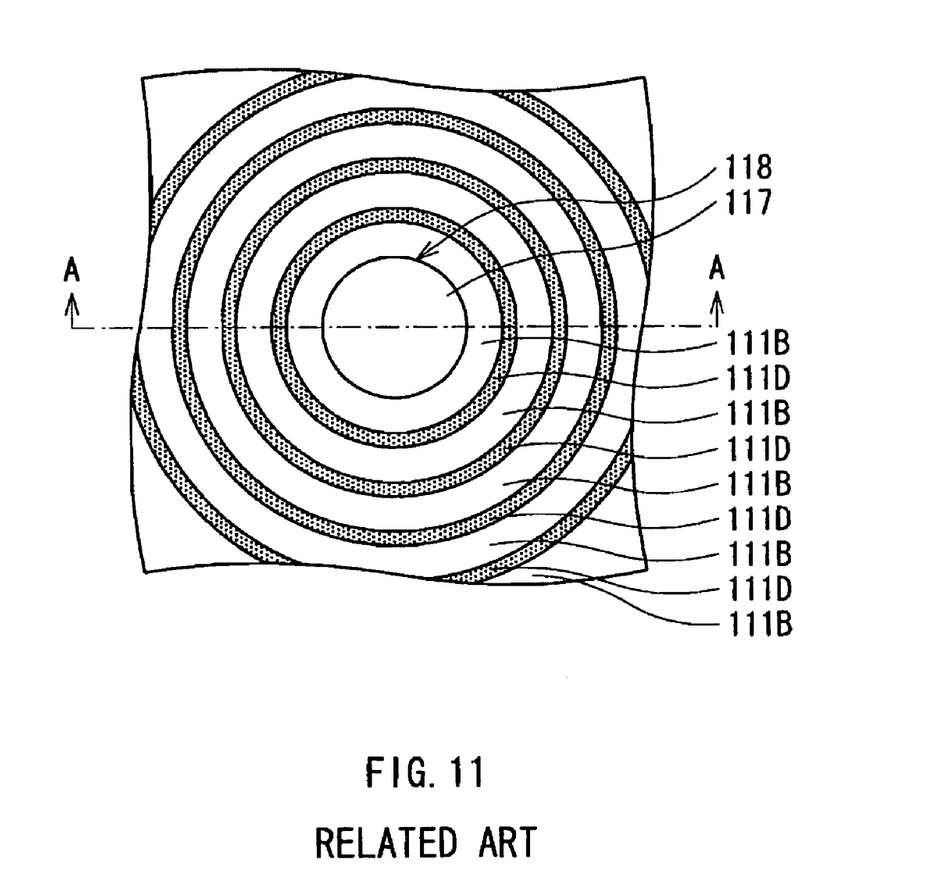
FIG. 11 is a top view of the laminated structure of FIG. 10.

The low-refractive index layer 111A contains much Al, and is easily oxidized. Thus, in the case where the low-refractive index layer 111A is exposed on the surface after etching, the low-refractive index layer 111A is immediately oxidized and tarnished into black. As a result, as illustrated in FIG. 10 and FIG. 11, a circular pattern is formed from an oxidized portion in the low-refractive index layer 111A (oxidized portion 111D). The surface of the oxidized portion 111D is more roughened compared to the surface of the high-refractive index layer 111B. Thus, there has been a disadvantage that in the case where the pedestal 122 is formed on the roughened surface, the pedestal 122 is shifted from a predetermined position or is separated, and the yield is lowered.

Thus, for example, as described in Japanese Unexamined Patent Application Publication 2005-93634, the laser diode may be structured as follows. That is, an etching stop layer is provided between the lower DBR layer 111 and the lower cladding layer 112. Etching in forming the mesa 118 is stopped by the etching stop layer, and then, the etching stop layer is removed. Thereby, the base region of the mesa 118 is planarized to prevent exposure of the low-refractive index layer 111A.

SUMMARY OF THE INVENTION

However, the etching stop layer contains P (phosphorus) and In (indium). Thus, there is a disadvantage that the etching stop layer does not lattice-match with the other semiconductor layers in the laminated structure 119, and crystal defect is easily generated. Further, in the case where the etching stop layer is provided between the lower DBR layer 111 and the lower cladding layer 112, there is also a disadvantage that the resonator length changes, the light confinement property deteriorates, and the threshold value enormously increases.

It is conceivable that one layer in the lower DBR layer 111 is replaced with the etching stop layer to prevent a change in the resonator length. In this case, however, since the material system of the etching stop layer is different from the material system of the layers other than the etching stop layer in the lower DBR layer 111, in forming the lower DBR layer 111, process temperature should be changed only in forming the etching stop layer. As a result, there is a disadvantage that the manufacturing process becomes difficult.

As described above, in the technique of Japanese Unexamined Patent Application Publication 2005-93634, in the case where the etching stop layer is used, other disadvantages such as the enormous increase of the threshold value and the more difficult manufacturing process are generated.

In the invention, it is desirable to provide a VCSEL capable of decreasing the lowering of the yield due to displacement and separation of the pedestal without the enormous increase of the threshold value and the more difficult manufacturing process, and a method of manufacturing the VCSEL.

According to an embodiment of the invention, there is provided a first VCSEL including a laminated structure including a lower multilayer film reflecting mirror, a lower cladding layer, an active layer, an upper cladding layer, and an upper multilayer film reflecting mirror sequentially, and an oxidation confinement layer above the lower multilayer film reflecting mirror. The laminated structure has a columnar mesa. The columnar mesa is formed in a region at least from a bottom face of a layer immediately above the lower multilayer film reflecting mirror to a top face of the laminated structure. Further, the laminated structure has a non-flat face in which end faces of a plurality of layers are exposed in a base of the mesa in the lower multilayer film reflecting mirror. The lower multilayer film reflecting mirror is formed by alternately laminating a low-refractive index layer with a high Al composition and a high-refractive index layer with a low Al composition. At least one of layers exposed in the non-flat face in a plurality of low-refractive index layers included in the lower multilayer film reflecting mirror is an oxidation inhibition layer containing Al having an Al composition ratio smaller than an Al composition ratio of a layer not exposed in the non-flat face in the plurality of low-refractive index layers included in the lower multilayer film reflecting mirror.

According to an embodiment of the invention, there is provided a second VCSEL including a laminated structure including a lower multilayer film reflecting mirror, a lower cladding layer, an active layer, an upper cladding layer, and an upper multilayer film reflecting mirror sequentially, and an oxidation confinement layer in the lower multilayer film reflecting mirror. The laminated structure has a columnar mesa. The columnar mesa is formed in a region at least from a bottom face of the oxidation confinement layer to a top face of the laminated structure. Further, the laminated structure has a non-flat face in which end faces of a plurality of layers are exposed in a base of the mesa in the lower multilayer film reflecting mirror. The lower multilayer film reflecting mirror is formed by alternately laminating a low-refractive index layer with a high Al (aluminum) composition and a high-refractive index layer with a low Al composition. At least one of layers exposed in the non-flat face in a plurality of low-refractive index layers included in the lower multilayer film reflecting mirror is an oxidation inhibition layer containing Al having an Al composition ratio smaller than an Al composition ratio of a layer not exposed in the non-flat face in the plurality of low-refractive index layers included in the lower multilayer film reflecting mirror.

In the first and second VCSELs of the embodiment of the invention, at least one of the layers exposed in the non-flat face in the plurality of low-refractive index layers included in the lower multilayer film reflecting mirror is the oxidation inhibition layer containing Al having the Al composition ratio smaller than the Al composition ratio of the layer not exposed in the non-flat face in the plurality of low-refractive index layers included in the lower multilayer film reflecting mirror. Thereby, in forming the oxidation confinement layer in the manufacturing step, oxidation of the layer exposed in the non-flat face in the plurality of low-refractive index layers included in the lower multilayer film reflecting mirror is decreased, and face roughening of the non-flat face is decreased. Further, the oxidation inhibition layer is made of the material system (material system containing Al) common to that of the layer not exposed in the non-flat face in the plurality of low-refractive index layers included in the lower multilayer film reflecting mirror. Thus, the oxidation inhibition layer does not function as an etching stop layer, and there is no possibility that the oxidation inhibition layer makes the manufacturing process difficult. Further, since the oxidation inhibition layer is provided in the lower multilayer film reflecting mirror, enormous increase of the threshold value is avoidable.

According to an embodiment of the invention, there is provided a first method of manufacturing a VCSEL including the following respective steps A1 to A3:

A1: step of forming, on a semiconductor substrate, a lower multilayer film reflecting mirror by alternately laminating a low-refractive index layer with a high Al (aluminum) composition and a high-refractive index layer with a low Al composition and making at least one of the plurality of low refractive layers into an oxidation inhibition layer containing Al having an Al composition ratio smaller than an Al composition ratio of other layers in the plurality of low-refractive index layers, and forming, on the lower multilayer film reflecting mirror, a lower cladding layer, an active layer, an upper cladding layer, and an upper multilayer film reflecting mirror in this order, and forming an oxidized layer above the lower multilayer film reflecting mirror, thereby forming a laminated structure;

A2: step of forming a columnar mesa by selectively etching the laminated structure in a region at least from a top face of the laminated structure to a bottom face of a layer immediately above the lower multilayer film reflecting mirror, and forming a non-flat face in which an end face of at least one of the oxidation inhibition layers is exposed in a base of the mesa in the lower multilayer film reflecting mirror; and A3: step of selectively oxidizing the oxidized layer from a side face of the mesa by oxidation treatment.

According to an embodiment of the invention, there is provided a second method of manufacturing a VCSEL including the following respective steps B1 to B3:

B1: step of forming, on a semiconductor substrate, a lower multilayer film reflecting mirror by alternately laminating a low-refractive index layer with a high Al (aluminum) composition and a high-refractive index layer with a low Al composition and making at least one of the plurality of low refractive layers into an oxidation inhibition layer containing Al having an Al composition ratio smaller than an Al composition ratio of other layers in the plurality of low-refractive index layers, and forming, on the lower multilayer film reflecting mirror, a lower cladding layer, an active layer, an upper cladding layer, and an upper multilayer film reflecting mirror in this order, and forming an oxidized layer in the lower multilayer film reflecting mirror, thereby forming a laminated structure;

B2: step of forming a columnar mesa by selectively etching the laminated structure in a region at least from a top face of the laminated structure to a bottom face of the oxidized layer, and forming a non-flat face in which an end face of at least one of the oxidation inhibition layers is exposed in a base of the mesa in the lower multilayer film reflecting mirror; and B3: step of selectively oxidizing the oxidized layer from a side face of the mesa by oxidation treatment.

In the first and second methods of manufacturing a VCSEL of the embodiment of the invention, the non-flat face in which an end face of at least one of the oxidation inhibition layers is formed in the base of the mesa in the lower multilayer film reflecting mirror. Thereby, in oxidizing the oxidized layer by oxidation treatment, oxidation of the layer exposed in the non-flat face in the plurality of low-refractive index layers included in the lower multilayer film reflecting mirror is decreased, and face roughening of the non-flat face is decreased. Further, the oxidation inhibition layer is made of the material system (material system containing Al) common to that of the layer not exposed in the non-flat face in the plurality of low-refractive index layers included in the lower multilayer film reflecting mirror. Thus, the oxidation inhibition layer does not function as an etching stop layer, and there is no possibility that the oxidation inhibition layer makes the manufacturing process difficult. Further, since the oxidation inhibition layer is provided in the lower multilayer film reflecting mirror, enormous increase of the threshold value is avoidable.

According to the first and second VCSELs of the embodiment of the invention, at least one of the layers exposed in the non-flat face in the plurality of low-refractive index layers included in the lower multilayer film reflecting mirror is the oxidation inhibition layer containing Al having the Al composition ratio smaller than the Al composition ratio of the layer not exposed in the non-flat face in the plurality of low-refractive index layers included in the lower multilayer film reflecting mirror. Thus, lowering of the yield due to displacement and separation of the pedestal may be decreased without the enormous increase of the threshold value and the more difficult manufacturing process.

According to the first and methods of manufacturing a VCSEL of the embodiment of the invention, the non-flat face in which an end face of at least one of the oxidation inhibition layers is exposed is formed in the base of the mesa in the lower multilayer film reflecting mirror. Thus, lowering of the yield due to displacement and separation of the pedestal may be decreased without the enormous increase of the threshold value and the more difficult manufacturing process.

Other and further objects, features and advantages of the invention will appear more fully from the following description.

DETAILED DESCRIPTION OF THE PREFERRED EMBODIMENT

Descriptions will be given of an embodiment of the invention in detail with reference to the drawings.

Figure 1:
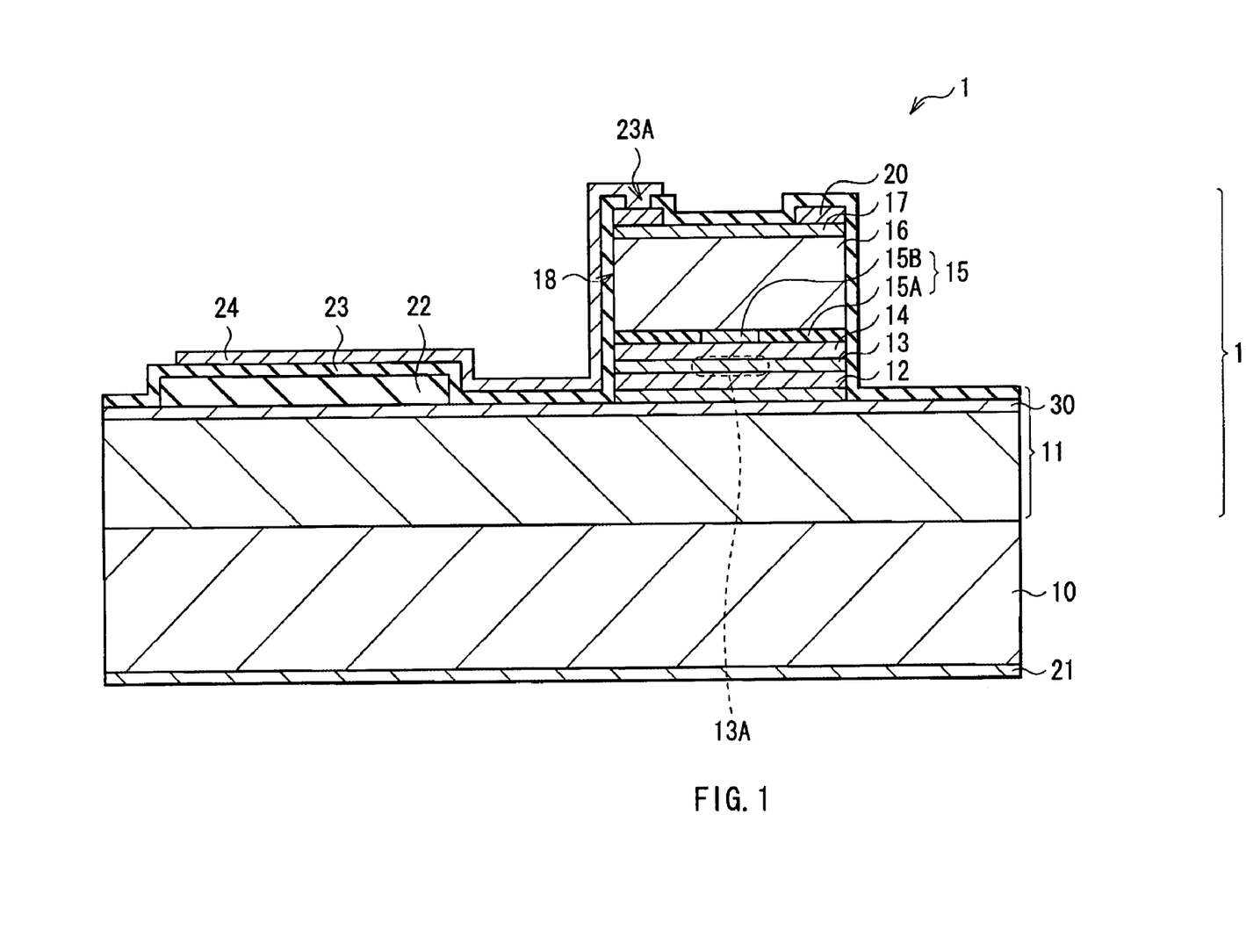
FIG. 1 illustrates a cross sectional view of a VCSEL according to an embodiment of the invention.

FIG. 1 illustrates an example of a cross sectional structure of a VCSEL 1 according to an embodiment of the invention. The VCSEL 1 according to the embodiment includes, for example, a laminated structure 19 on one face side of a substrate 10. The laminated structure 19 is formed by laminating a lower DBR layer 11 (lower multilayer film reflecting mirror), a lower cladding layer 12, an active layer 13, an upper cladding layer 14, a current confinement layer 15 (oxidized confinement layer), an upper DBR layer 16 (upper multilayer film reflecting mirror), and a contact layer 17 in this order from the substrate 10 side. In the upper section of the laminated structure 19, specifically, in the upper section of the lower DBR layer 11, the lower cladding layer 12, the active layer 13, the upper cladding layer 14, the current confinement layer 15, the upper DBR layer 16, and the contact layer 17, a columnar mesa 18 is formed.

The current confinement layer 15 is not necessarily provided between the upper cladding layer 14 and the upper DBR layer 16. For example, the current confinement layer 15 may be provided in the upper DBR layer 16, between the lower DBR layer 11 and the lower cladding layer 12, in the lower DBR layer 11 or the like. However, in the case where the current confinement layer 15 is provided in the region above the lower DBR layer 11 as illustrated in FIG. 1, the mesa 18 is preferably formed in the region at least from the bottom face of the layer immediately above the lower DBR layer 11 (lower cladding layer 12 in FIG. 1) to the top face of the laminated structure 19 (contact layer 17 in FIG. 1). Further, though not illustrated, in the case where the current confinement layer 15 is provided in the lower DBR layer 11, the mesa 18 is preferably provided in the region at least from the bottom face of the current confinement layer 15 to the top face of the laminated structure 19.

The mesa 18 is in the shape of a column having the central axis in the lamination direction. The side face (perimeter face) of the mesa 18 is a vertical plane crossing perpendicular to (or almost perpendicular to) a lamination plane. The mesa 18 is, for example, formed by anisotropic dry etching. Further, a base of the mesa 18 spreads over the top face of the lower DBR layer 11. As illustrated in an enlarged view of the laminated structure 19 in FIG. 2, the base is a non-flat face 11C in which end faces of a plurality of layers are exposed. For the non-flat face 11C, a detailed description will be given later.

Figure 2:
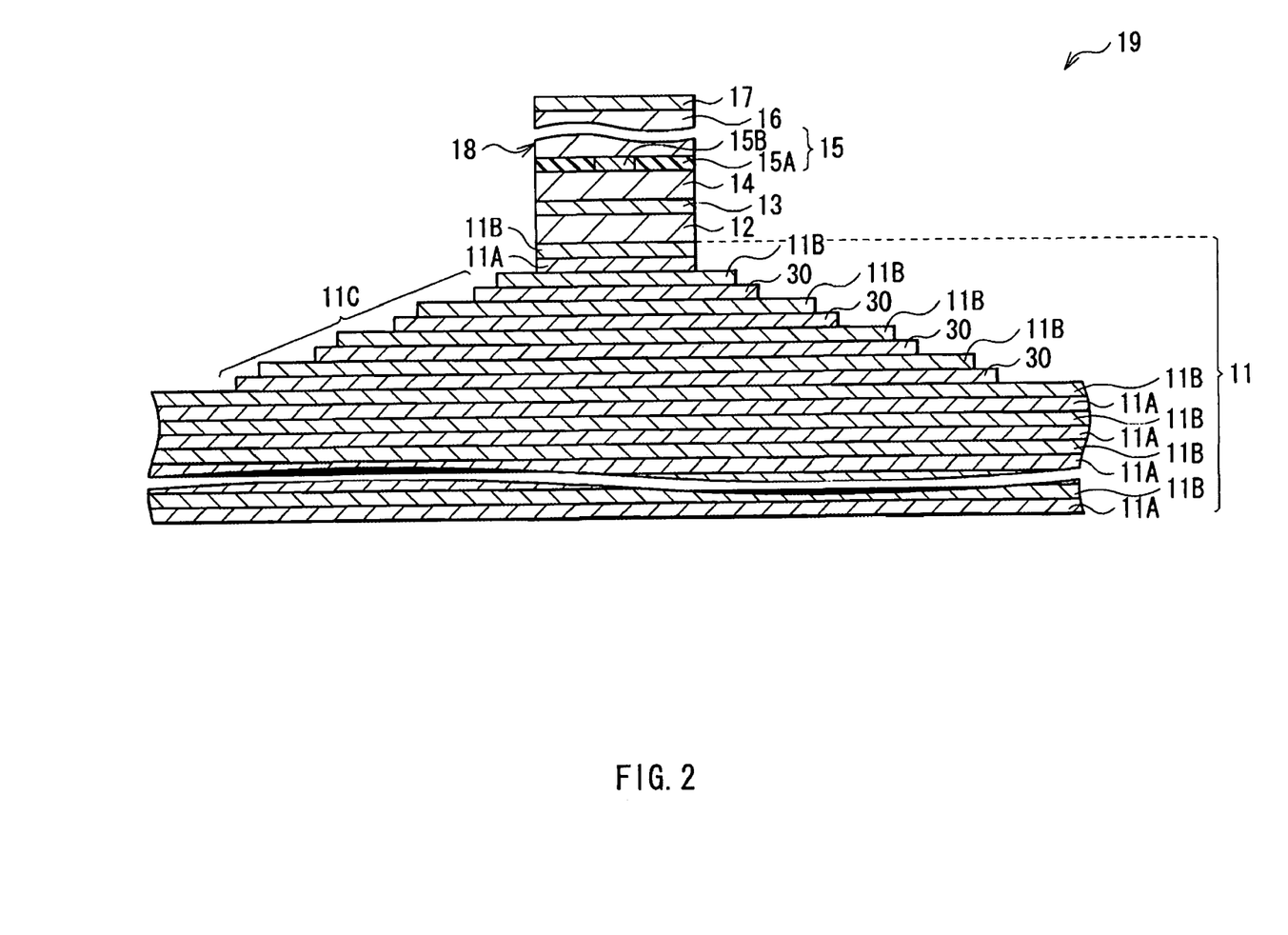
FIG. 2 is an enlarged view of the laminated structure of FIG. 1.

The substrate 10 is made of, for example, n-type GaAs. As illustrated in FIG. 2, the lower DBR layer 11 is formed by alternately layering a low-refractive index layer 11A and a high-refractive index layer 11B. The low-refractive index layer 11A is made of, for example, n-type $Al_{x1}Ga_{1-x1}As$ ($0<x1<1$) having an optical thickness of $\lambda/4$ ($\lambda$ is an oscillation wavelength). The high-refractive index layer 11B is made of, for example, n-type $Al_{x2}Ga_{1-x2}As$ ($0 \leq x2<x1$) having an optical thickness of $\lambda/4$. The low-refractive index layer 11A is made of a material having an Al (aluminum) composition ratio higher than that of the high-refractive index layer 11B, and has a property being oxidized easily than the high-refractive index layer 11B. The lower cladding layer 12 is made of, for example, n-type $Al_{x3}Ga_{1-x3}As$ ($0 \leq x3<1$). The substrate 10, the lower DBR layer 11, and the lower cladding layer 12 contain an n-type impurity such as silicon (Si) and selenium (Se).

The active layer 13 is made of, for example, a GaAs material. In the active layer 13, the central section in the lamination in-plane direction of the active layer 13 (region opposed to the after-mentioned current injection region 15B) is a light emission region 13A.

The upper cladding layer 14 is made of, for example, p-type $Al_{x4}Ga_{1-x4}As$ ($0 \leq x4<1$). The upper DBR layer 16 is formed by alternately layering a low-refractive index layer (not illustrated) and a high-refractive index layer (not illustrated). The low-refractive index layer is made of, for example, p-type $Al_{x5}Ga_{1-x5}As$ ($0<x5<1$) having an optical thickness of $\lambda/4$. The high-refractive index layer is made of, for example, p-type $Al_{x6}Ga_{1-x6}As$ ($0 \leq x6<x5$) having an optical thickness of $\lambda/4$. The contact layer 17 is made of, for example, p-type $Al_{x7}Ga_{1-x7}As$ ($0 \leq x7 < 1$). The upper cladding layer 14, the upper DBR layer 16, and the contact layer 17 contain a p-type impurity such as carbon (C), zinc (Zn), magnesium (Mg), and beryllium (Be).

The current confinement layer 15 has a current confinement region 15A in a region from the side face of the mesa 18 to a region with a predetermined depth. The other region (central region of the mesa 18) is the current injection region 15B. The current injection region 15B is made of, for example, p-type $Al_{x8}Ga_{1-x8}As$ ($0 \leq x8 \leq 1$). The current confinement region 15A contains, for example, $Al_2O_3$ (aluminum oxide). As will be described later, the current confinement region 15A is obtained by oxidizing highly-concentrated Al contained in an oxidized layer 15D from the side face. Therefore, the current confinement layer 15 has a function to confine a current.

The current confinement layer 15 is formed in the mesa 18. The current confinement region 15A is, for example, in the shape of a ring plate having a diameter of about 40 μm centering on the central axis of the current injection region 15B. The diameter is appropriately adjusted according to the oxidation rate, the oxidation time and the like in an oxidation step so that a non-oxidized region (current injection region 15B) having a certain size is left in the mesa 18 in the after-mentioned oxidation step.

A circular upper electrode 20 having an aperture in a region opposed to the current injection region 15B is provided on the top face of the mesa 18. The upper electrode 20 has a structure in which, for example, titanium (Ti), platinum (Pt), and gold (Au) are laminated sequentially from the top face side of the mesa 18, and is electrically connected to the contact layer 17. Further, a lower electrode 21 is provided on the rear face of the substrate 10. The lower electrode 21 has a structure in which, for example, an alloy of gold (Au) and germanium (Ge), nickel (Ni), and gold (Au) are laminated sequentially from the substrate 10 side, and is electrically connected to the substrate 10.

Further, in this embodiment, an insulative pedestal 22 is provided in the base region of the mesa 18 of the top face of the lower DBR layer 11 for the purpose of decreasing the capacity component of an electrode pad 24 (described later). Further, an insulative protective film 23 is provided on the entire surface other than part of the upper electrode 20. The protective film 23 has an aperture 23A on the upper electrode 20. In the aperture 23A, the part of the upper electrode 20 is exposed. Further, on the surface of the protective film 23, the electrode pad 24 is formed from the pedestal 22 to the exposed portion in the aperture 23A of the upper electrode 20. The electrode pad 24 is formed by, for example, laminating titanium (Ti), platinum (Pt), and gold (Au) in this order. The electrode pad 24 is in contact with the upper electrode 20, and is electrically connected to the upper electrode 20.

In this embodiment, as described above, the base of the mesa 18 spreads over the top face of the lower DBR layer 11. As illustrated in FIG. 2, the base is the non-flat face 11C in which the end faces of the plurality of layers are exposed. The non-flat face 11C is generated from etching unevenness in forming the mesa 18, and in a state of a step in which the end faces of the low-refractive index layer 11A and the high-refractive index layer 11B included in the lower DBR layer 11 are alternatively exposed. In this embodiment, at least one of the layers exposed in the non-flat face 11C out of the plurality of low-refractive index layers 11A included in the lower DBR layer 11 is an oxidation inhibition layer 30.

FIG. 2 illustrates a case where the oxidation inhibition layer 30 is formed only in the layers corresponding to the non-flat face 11C in the lower DBR layer 11. However, the oxidation inhibition layer 30 may be also formed in the layers other than the layers corresponding to the non-flat face 11C in the lower DBR layer 11. Further, FIG. 2 illustrates a case where all layers exposed in the non-flat face 11C in the plurality of low-refractive index layers 11A included in the lower DBR layer 11 are the oxidation inhibition layer 30. However, only the layer contacted with the pedestal 22 out of the layers exposed in the non-flat face 11C in the plurality of low-refractive index layers 11A included in the lower DBR layer 11 may be the oxidation inhibition layer 30. It is not necessary that all layers contacted with the pedestal 22 in the low-refractive index layers 11A included in the lower DBR layer 11 are the oxidation inhibition layer 30. It is enough that at least one layer thereof is the oxidation inhibition layer 30.

The oxidation inhibition layer 30 contains Al with a composition ratio smaller than the Al composition ratio of the layers not exposed in the non-flat face 11C in the plurality of low-refractive index layers 11A included in the lower DBR layer 11. The oxidation inhibition layer 30 is made of, for example, n-type $Al_{x9}Ga_{1-x9}As$ ($x2 < x9 < x1$) having an optical thickness, for example, of $\lambda/4$ ($\lambda$ is an oscillation wavelength). The oxidation inhibition layer 30 is made of the same material system as that of the low-refractive index layer 11A and the high-refractive index layer 11B included in the lower DBR layer 11 (material system containing Al). That is, the oxidation inhibition layer 30 does not function as an etching stop layer in relation to the lower DBR layer 11.

Figure 3:
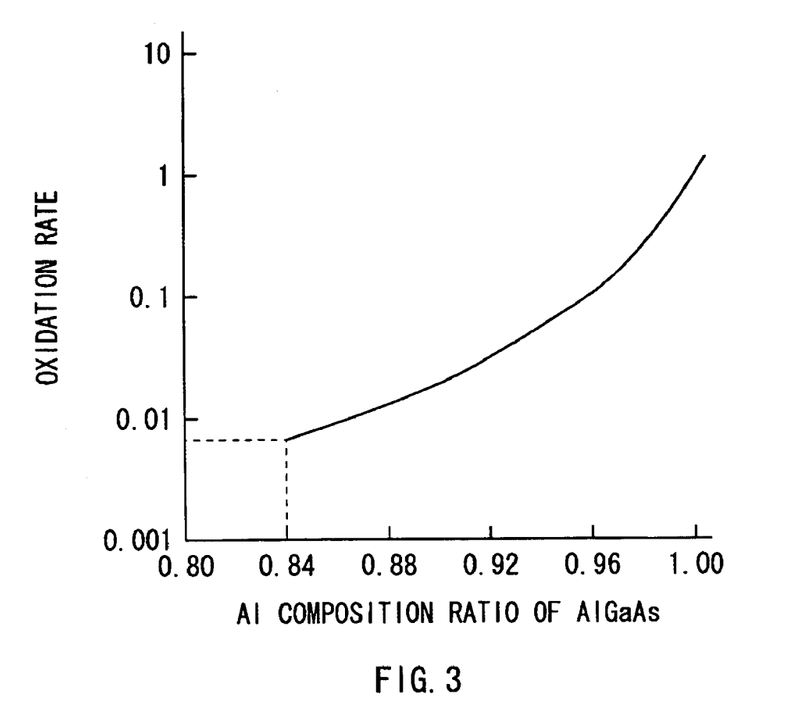
FIG. 3 is a relation diagram illustrating a relation between an Al composition ratio of AlGaAs and an oxidation rate.

The upper limit of Al composition ratio X9 of the oxidation inhibition layer 30 is preferably specified so that the oxidation rate of the oxidation inhibition layer 30 itself is sufficiently small in the after-mentioned oxidation step. For example, taking the relational expression between an Al composition ratio of AlGaAs and an oxidation rate illustrated in FIG. 3 (cited from K. D. Choquette, et al., IEEE, pp. 209 to 203, 1999) into consideration, the Al composition ratio X9 of the oxidation inhibition layer 30 is preferably smaller than Al composition ratio (for example, 0.84) with which an oxidation rate that is one digit smaller than the oxidation rate (for example, 0.1) of the low refractive layer 11A is obtained. Further, the lower limit of the Al composition ratio X9 of the oxidation inhibition layer 30 is preferably specified so that the refractive index difference between the oxidation inhibition layer 30 and the high-refractive index layer 11B is larger than 0.3.

Further, the oxidation inhibition layer 30 is preferably provided outside of a resonator defined by a resonator length obtained by dividing light intensity in the active layer 13 by a base of natural logarithm. That is, the oxidation inhibition layer 30 is preferably provided in a location where the resonator length is not different from that of a case not using the oxidation inhibition layer 30. In the case where the resonator length is increased, light confinement property deteriorates, and the threshold value increases.

Figure 4A:
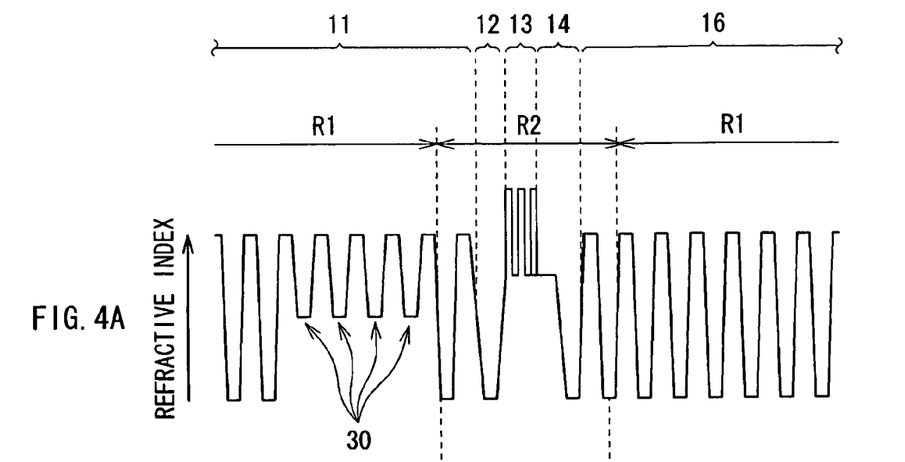
FIGS. 4A and 4B are a relation diagram illustrating a relation between a refractive index distribution and a light intensity of the laser diode of FIG. 1.

For example, if a comparison is made between a case that the oxidation inhibition layer 30 is provided outside of the resonator defined by resonator length L (region outside resonator R1) (FIGS. 4A and 4B) and a case that the oxidation inhibition layer 30 is not provided anywhere (FIGS. 5A and 5B), it is found that while the refractive index distributions (FIG. 4A and FIG. 5A) are different from each other, the light intensity distributions (FIG. 4B and FIG. 5B) almost correspond with each other. The light intensity distributions of FIG. 4B and FIG. 5B are obtained from a result of simulation by using the refractive index distributions of FIG. 4A and FIG. 5A under the same driving conditions.

Figure 6A:
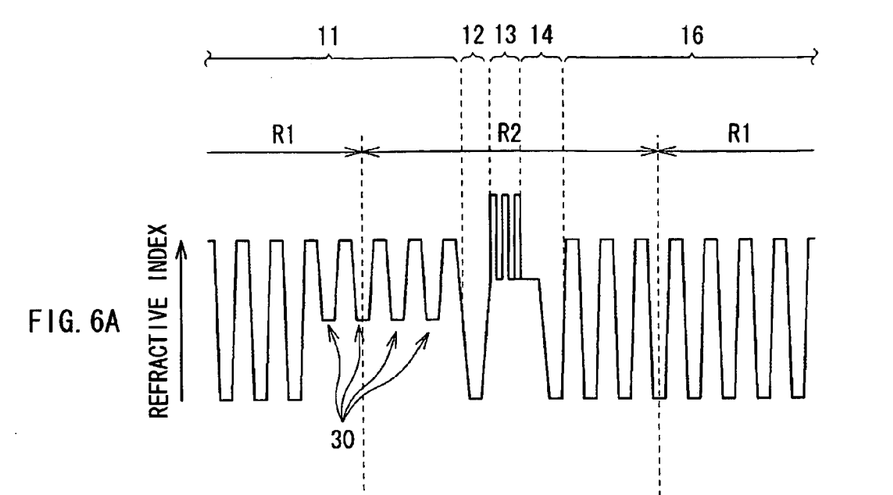
FIGS. 6A and 6B are a relation diagram illustrating a relation between a refractive index distribution and a light intensity of a laser diode according to another reference example.

Meanwhile, if a comparison is made between a case that the oxidation inhibition layer 30 is provided outside of the resonator defined by the resonator length L (region outside resonator R1) (FIGS. 4A and 4B) and a case that the oxidation inhibition layer 30 is provided in the resonator defined by the resonator length L (region inside resonator R2) (FIGS. 6A and 6B), it is found that while the refractive index distributions (FIG. 4A and FIG. 6A) are similar to each other, the light intensity distributions (FIG. 4B and FIG. 6B) are totally different from each other. The light intensity distribution of FIG. 6B is obtained from a result of simulation by using the refractive index distribution of FIG. 6A under the same driving conditions as those of FIGS. 4A and 4B.

Figure 4B:
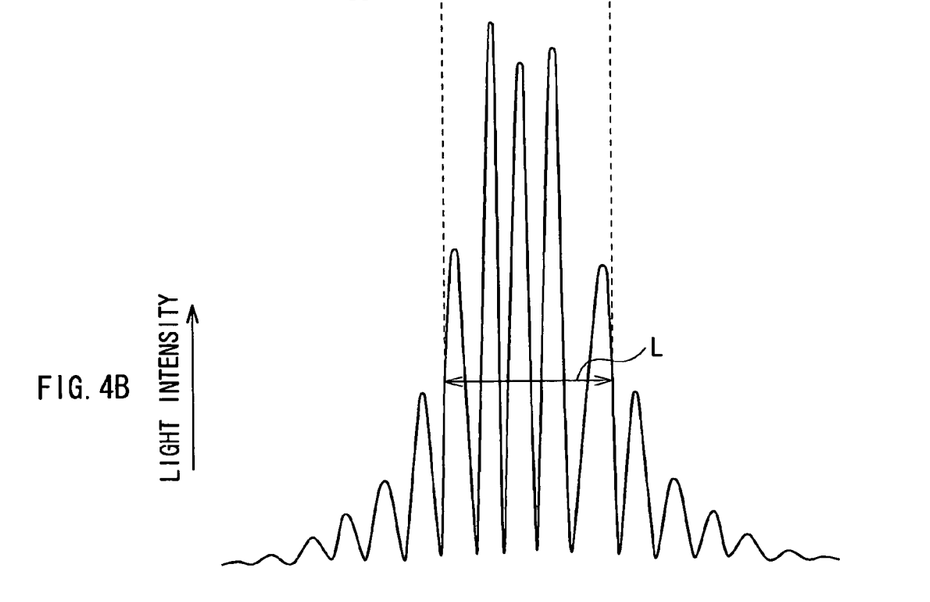
Figure 5A:
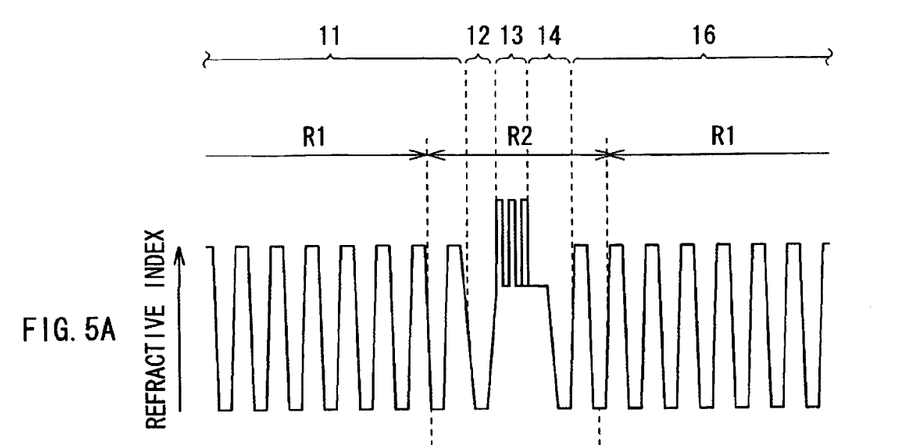
FIGS. 5A and 5B are a relation diagram illustrating a relation between a refractive index distribution and a light intensity of a laser diode of a reference example.
Figure 5B:
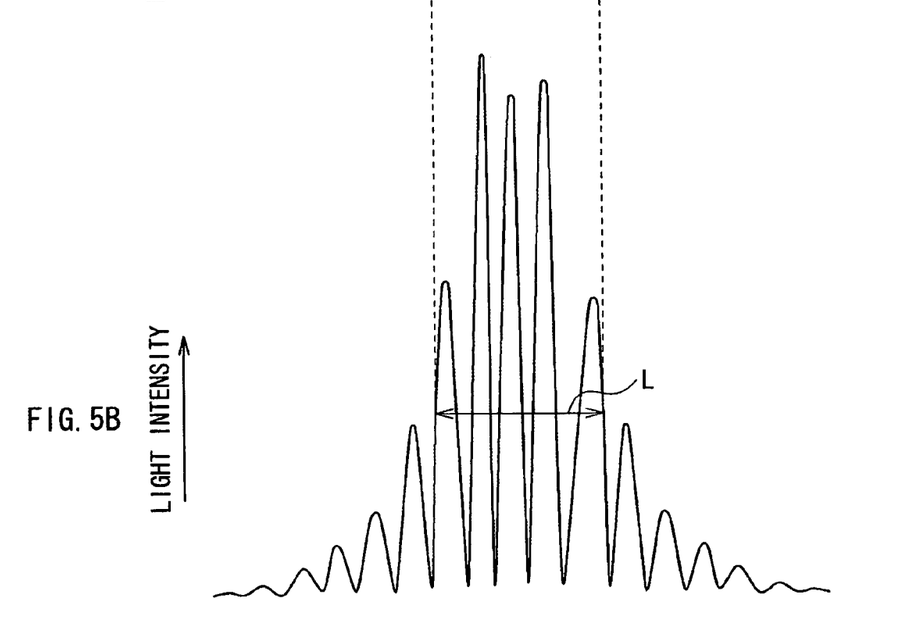
Figure 6B:
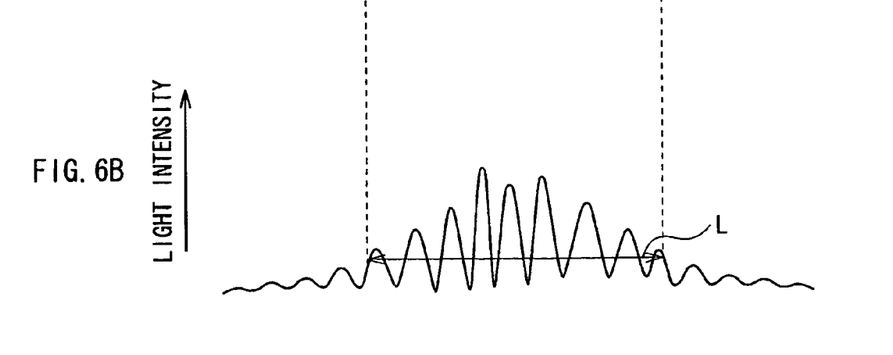

It is found that in FIG. 6B, since the oxidation inhibition layer 30 is provided in the resonator defined by the resonator length L (region inside resonator R2), the light confinement property deteriorates, and the resonator length L is enormously larger than that of FIG. 4B and FIG. 5B. Further, it is found that since the light confinement property deteriorates, laser oscillation is not generated, and the light intensity in the active layer 13 is extremely lowered. Therefore, to generate laser oscillation in the case of FIG. 6A, it is necessary to increase power to be injected in the laser diode, and as a result, the threshold value increases.

The laser diode 1 having the foregoing structure may be manufactured, for example, as follows.

Here, compound semiconductor layers on the substrate 10 made of GaAs are formed by, for example, MOCVD (Metal Organic Chemical Vapor Deposition) method. As a raw material of the compound semiconductor layers, for example, trimethyl aluminum (TMA), trimethyl gallium (TMG), or arsine ($AsH_3$) is used. As a raw material of a donor impurity, for example, $H_2Se$ is used. As a raw material of an acceptor impurity, for example, dimethyl zinc (DMZ) is used.

Figure 7:
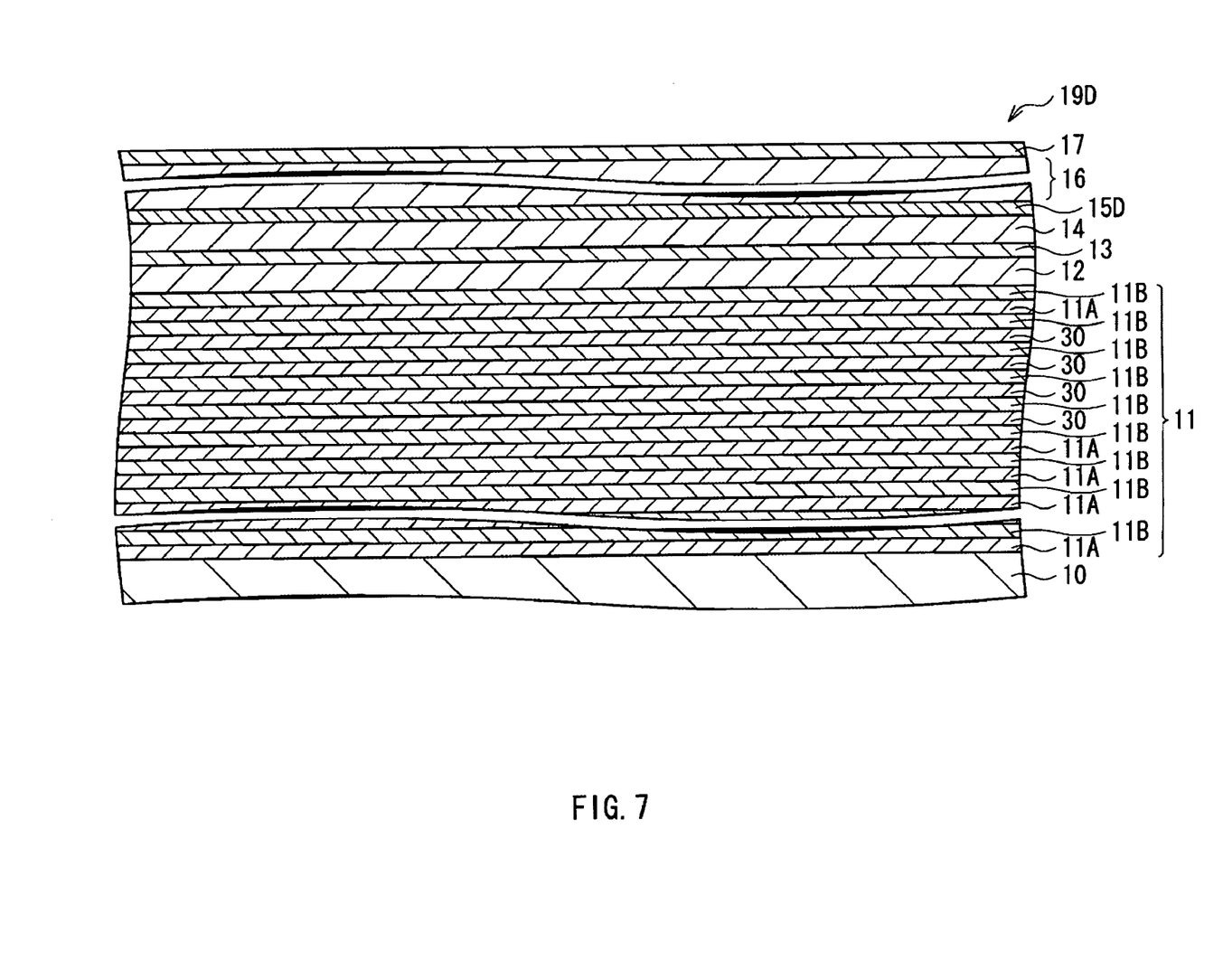
FIG. 7 illustrates a cross sectional view for explaining a step of manufacturing the laser diode of FIG. 1.

First, the low-refractive index layer 11A having a high Al composition and the high-refractive index layer 11B having a low Al composition are alternately laminated on the substrate 10, at least one of the plurality of low-refractive index layers 11A is made into the oxidation inhibition layer 30 including an Al composition ratio smaller than the Al composition ratio of the other layers of the plurality of low-refractive index layers 11A, and thereby the lower DBR layer 11 is formed. Subsequently, on the lower DBR layer 11, the lower cladding layer 12, the active layer 13, the upper cladding layer 14, and the upper DBR layer 16 are formed in this order, the oxidized layer 15D is formed in a predetermined location, and thereby the laminated structure 19D is formed (FIG. 7).

The oxidation inhibition layer 30 in the lower DBR layer 11 may be formed by, for example, as follows. That is, out of the process conditions in forming the low-refractive index layer 11A in the lower DBR layer 11, the flow rate of trimethyl aluminum (TMA) is increased and the flow rate of trimethyl gallium (TMG) is decreased, and Al with a composition ratio smaller than the Al composition ratio of the low-refractive index layer 11A in the lower DBR layer 11 is contained in the layer to become the oxidation inhibition layer 30. In other words, in the manufacturing step, the formation of the oxidation inhibition layer 30 is performed by slightly changing the process conditions of the step of forming the lower DBR layer of a laser diode of related art not having the oxidation inhibition layer 30. No extraordinary difficult step is added to the steps of related art.

Figure 8:
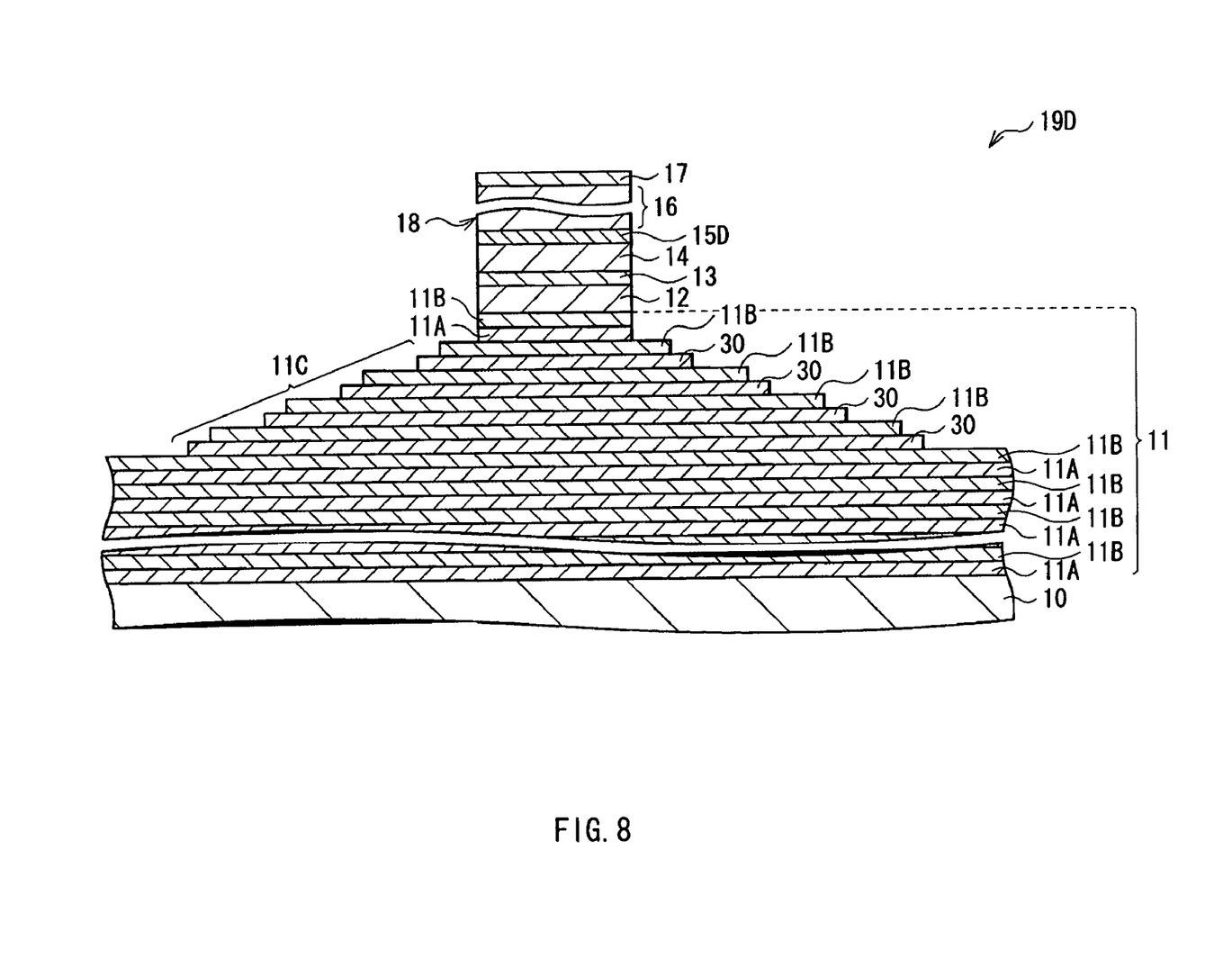
FIG. 8 is a cross sectional view for explaining a step following FIG. 7.

Next, a photoresist (not illustrated) is formed on the entire top face of the contact layer 17. After that, photolithography process and developing process are performed. Thereby, for example, a circular resist layer having the same diameter as the diameter of the mesa 18 is formed (not illustrated). After that, for example, by dry etching, a region from the top face of the laminated structure 19D down to a location with a predetermined depth is selectively etched with the use of the resist layer as a mask. Thereby, the columnar mesa 18 is formed, and the non-flat face 11C is formed in the base region of the mesa 18 (FIG. 8).

In the case where the oxidized layer 15D is formed above the lower DBR layer 11, the mesa 18 is preferably formed by selectively etching the laminated structure 19D at least from the top face of the laminated structure 19D down to the bottom face of the layer immediately above the lower DBR layer 11. Further, in the case where the oxidized layer 15D is formed in the lower DBR layer 11, the mesa 18 is preferably formed by selectively etching the laminated structure 19D at least from the top face of the laminated structure 19 down to the bottom face of the oxidized layer 15D.

Next, the resist layer is removed. After that, oxidation treatment is performed at high temperature in the water vapor atmosphere to selectively oxidize the oxidized layer 15D from the side face of the mesa 18 (refer to FIG. 2). Thereby, the region from the side face to a location with a predetermined depth in the oxidized layer 15D becomes an oxidized region (insulative region) containing aluminum oxide, and such a region becomes the current confinement region 15A. The region located inner from the current confinement region 15A becomes a non-oxidized region; and such a region becomes the current injection region 15B. Thereby, the laminated structure 19 having the current confinement layer 15 composed of the current confinement region 15A and the current injection region 15B is formed.

Next, the circular upper electrode 20 is formed on the top face of the mesa 18 (refer to FIG. 1). Subsequently, the pedestal 22 is formed on the top face including the non-flat face 11C in the lower DBR layer 11, the protective film 23 having the aperture 23A in part of the region opposed to the upper electrode 21 is formed, and the electrode pad 24 is formed over from the pedestal 22 to the exposed portion in the aperture 23A in the upper electrode 20 (refer to FIG. 1). Finally, the lower electrode 21 is formed on the rear face of the substrate 10 (refer to FIG. 1). Consequently, the VCSEL 1 of this embodiment is manufactured.

Next, operation and effect of the laser diode 1 of this embodiment will be described.

In the VCSEL 1 of this embodiment, when a certain voltage is applied between the electrode pad 24 and the lower electrode 21, a current is injected into the active layer 13 through the current injection region 15B. Thereby, light is emitted due to electron-hole recombination. Such light is reflected by the pair of the lower DBR layer 11 and the upper DBR layer 16. Laser oscillation is generated at a predetermined wavelength. Then, the light is emitted as a laser beam from the aperture of the upper electrode 21 outside.

In this embodiment, in the manufacturing step, the low-refractive index layer 11A having a high Al (aluminum) composition and the high-refractive index layer 11B having a low Al composition are alternately laminated, at least one of the plurality of low-refractive index layers 11A is made into the oxidation inhibition layer 30 containing Al having an Al composition ratio smaller than the Al composition ratio of the other layers of the plurality of low-refractive index layers 11A, and thereby the lower DBR layer 11 is formed. Thus, an end face of at least one oxidation inhibition layer 30 is able to be exposed in the non-flat face 11C spreading in the base of the mesa 18 that is formed in association with the formation of the mesa 18. Therefore, in the plurality of low-refractive index layers 11A included in the lower DBR layer 11, oxidation of the layer exposed in the non-flat face 11C is decreased, and face roughening of the non-flat face 11C is decreased. As a result, contact characteristics between the non-flat face 11C and the pedestal 22 are improved. Therefore, the non-flat face 11C is prevented from being shifted from a predetermined position or being separated, and thus lowering of the yield is able to be prevented.

The oxidation inhibition layer 30 is made of the material system (material system containing Al) common to that of the layer not exposed in the non-flat face 11C in the plurality of low-refractive index layers 11A included in the lower DBR layer 11. Thus, the oxidation inhibition layer 30 does not function as an etching stop layer, and there is no possibility that the oxidation inhibition layer 30 makes the manufacturing process difficult. Further, the oxidation inhibition layer 30 lattice-matchs with other semiconductor layers in the laminated structure 19. Thus, if the oxidation inhibition layer 30 is provided, no crystal defect is generated. Further, since the oxidation inhibition layer 30 is provided in the lower DBR layer 11, enormous increase of the threshold value is avoidable. In particular, in the case where the oxidation inhibition layer 30 is provided in the region outside resonator R1, there is no possibility that the threshold value is changed and there is no possibility that adverse effect is exerted due to the oxidation inhibition layer 30.

Descriptions have been hereinbefore given of the invention with reference to the embodiment. However, the invention is not limited to the foregoing embodiment and the like, and various modifications may be made.

For example, in the foregoing embodiment and the like, while the description has been given of a case that the n-type semiconductor substrate is used as the substrate 10, a p-type semiconductor substrate may be used. In this case, however, the conductivity type of the impurity illustrated in the foregoing embodiment is to be changed from p-type to n-type, or n-type to p-type.

Further, in the foregoing embodiment and the like, the invention has been described with reference to the AlGaAs compound semiconductor laser as an example. However, the invention is also applicable to other compound laser diode containing Al.

The present application contains subject matter related to that disclosed in Japanese Priority Patent Application JP 2008-112212 filed in the Japanese Patent Office on Apr. 23, 2008, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a Vertical Cavity Surface Emitting Laser comprising the steps of:

forming, on a semiconductor substrate, a lower multilayer film reflecting mirror by alternately laminating a low-refractive index layer with a high Al (aluminum) composition and a high-refractive index layer with a low Al composition and making at least one of the plurality of low-refractive index layers into an oxidation inhibition layer containing Al having an Al composition ratio smaller than an Al composition ratio of other layers in the plurality of low-refractive index layers, forming, on the lower multilayer film reflecting mirror, a lower cladding layer, an active layer, an upper cladding layer, and an upper multilayer film reflecting mirror in this order and forming an oxidized layer above the lower multilayer film reflecting mirror, thereby forming a laminated structure;

forming a columnar mesa by selectively etching the laminated structure in a region at least from the top face of the laminated structure to the bottom face of a layer immediately above the lower multilayer film reflecting mirror and forming a non-flat face in which an end face of at least one of the oxidation inhibition layers is exposed in a base of the mesa in the lower multilayer film reflecting mirror; and selectively oxidizing the oxidized layer from a side face of the mesa by oxidation treatment.

2. A method of manufacturing a Vertical Cavity Surface Emitting Laser comprising the steps of:

forming, on a semiconductor substrate, a lower multilayer film reflecting mirror by alternately laminating a low-refractive index layer with a high Al (aluminum) composition and a high-refractive index layer with a low Al composition and making at least one of the plurality of low-refractive index layers into an oxidation inhibition layer containing Al having an Al composition ratio smaller than an Al composition ratio of other layers in the plurality of low-refractive index layers, forming, on the lower multilayer film reflecting mirror, a lower cladding layer, an active layer, an upper cladding layer, and an upper multilayer film reflecting mirror in this order and forming an oxidized layer in the lower multilayer film reflecting mirror, thereby forming a laminated structure;

forming a columnar mesa by selectively etching the laminated structure in a region at least from the top face of the laminated structure to the bottom face of the oxidized layer and forming a non-flat face in which an end face of at least one of the oxidation inhibition layers is exposed in a base of the mesa in the lower multilayer film reflecting mirror; and selectively oxidizing the oxidized layer from a side face of the mesa by oxidation treatment.

* * * * *